United States Patent [19]
Martin et al.

[11] Patent Number: 6,094,704
[45] Date of Patent: Jul. 25, 2000

[54] MEMORY DEVICE WITH PIPELINED ADDRESS PATH

[75] Inventors: Chris G. Martin, Boise; Troy A. Manning, Meridian, both of Id.

[73] Assignee: Micron Technology, Inc., Boise, Id.

[21] Appl. No.: 08/877,133

[22] Filed: Jun. 17, 1997

[51] Int. Cl.$^7$ ................................................ G11C 8/00
[52] U.S. Cl. ..................... 711/105; 365/222; 365/233; 711/104; 711/5; 711/202
[58] Field of Search ............................... 365/233, 222, 365/238.5, 230.03; 711/5, 106, 105, 150, 202, 104

[56] References Cited

U.S. PATENT DOCUMENTS

| | | | |
|---|---|---|---|
| 5,825,711 | 10/1998 | Manning | 365/230.03 |
| 5,831,922 | 11/1998 | Choi | 365/222 |
| 5,831,929 | 11/1998 | Manning | 365/233 |
| 5,848,025 | 12/1998 | Marietta | 365/238.5 |
| 5,859,809 | 1/1999 | Kim | 365/222 |

OTHER PUBLICATIONS

Descriptive literature entitled, "400 MHz SLDRAM, 4M×16 SLDRAM Pipelined, Eight Bank, 2.5 V Operation", pp. 1–22.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Do Hyun Yoo
*Assistant Examiner*—Than Nguyen
*Attorney, Agent, or Firm*—Dorsey & Whitney LLP

[57] ABSTRACT

In a packetized memory device, row and column address paths receive row and column addresses from an address capture circuit. Each of the row and column address paths includes a respective address latch that latches the row or column address from the address capture circuitry, thereby freeing the address capture circuitry to capture a subsequent address. The latched row and column addresses are then provided to a combining circuit. Additionally, redundant row and column circuits receive these latched addresses and indicate to the combining circuit whether or not to substitute a redundant row. The combining circuit, responsive to a strobe then transfers the redundant row address or latched row address to a decoder to activate the array.

20 Claims, 4 Drawing Sheets

MEMORY DEVICE WITH PIPELINED ADDRESS PATH

TECHNICAL FIELD

The present invention relates to integrated circuit devices, and more particularly to synchronous memory devices.

BACKGROUND OF THE INVENTION

Conventional computer systems include a processor coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of the computer system, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at frequency that is a substantially lower than the clock frequency of the processor. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines which have been omitted from FIG. 1 in the interests of brevity. For example, as explained below, the memory devices 16a–c also receive a master clock signal MCLK to provide internal timing signals, a data clock signal DCLK clocking data into or out of the memory device 16, and a FLAG signal signifying the start of a command packet.

One of the memory devices 16a is shown in block diagram form in FIG. 2. The memory device 16a includes a clock divider and delay circuit 40 that receives a master clock signal MCLK and generates an internal clock signal CKINT and a large number of other clock and timing signals to control the timing of various operations in the memory device 16. The memory device 16 also includes a command buffer 46 and an address capture circuit 48 which receive an internal clock signal CKINT, a command packet CA0–CA9 on a 10-bit command bus 50, and a FLAG signal on line 52. As explained above, the command packet contains control and address information for each memory transfer, and the FLAG signal identifies the start of a command packet which may include more than one 10-bit packet word. In fact, a command packet is generally in the form of a sequence of 10-bit packet words on the 10-bit command bus 50. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides a command word to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command packet. The address is provided to an address sequencer 64 which generates a corresponding 3-bit bank address on bus 66, a 10-bit row address on bus 68, and a 7-bit column address on bus 70. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receive a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied through a column address path 75 to a redundant column circuit 71 that determines if the column address corresponds to a defective address. The redundant column circuit 71 outputs either the column. address or a redundant column address to a column latch/decoder 100 which supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a bank of DC sense amplifiers 103 and a read latch 120 that amplify and store data from the I/O gating circuit 102. In the memory device 16a shown in FIG. 2, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked through the read FIFO buffer 124 by a clock signal RCLK generated from the internal clock CKINT by a programmable delay circuit 126. The read FIFO buffer 124 sequentially applies the 16-bit words to a driver circuit 128 which, in turn, applies the 16-bit data words to a data bus 130 forming part of the processor bus 14.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144 responsive to the data clock DCLK. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

As mentioned above, an important goal of the SyncLink architecture is to allow data transfer between a processor and a memory device to occur at a significantly faster rate. However, the operating rate of a packetized DRAM, including the packetized DRAM shown in FIG. 2, is limited by the time required to receive and process command packets applied to the memory device 16a. More specifically, not only must the command packets be received and stored, but they must also be decoded and used to generate a wide variety of signals, including row, bank and column addresses. However, in order for the memory device 16a to operate at a very high speed, the command packets must be applied to the memory device 16a at a correspondingly high speed. As the operating speed of the memory device 16a increases, the command packets are provided to the memory device 16a at a rate that can exceed the rate at which the address capture circuit 48, the address predecoders 84, the row address registers 86, the latch/decoder/drivers 82a–h, and the column address path 75 can capture and process the addresses.

Although the foregoing discussion is directed to the need for faster command buffers in packetized DRAMs, similar problems exist in other memory devices, such as asynchronous DRAMs and synchronous DRAMs, which must process control and other signals at a high rate of speed. Thus, for the reasons explained above, the limited operating speed of conventional processing of addresses and commands threatens to limit the maximum operating speed of memory devices, particularly packetized DRAMs. Therefore, there is a need for address handling circuitry that is able to receive and process command packets, including addresses, at a high rate.

SUMMARY OF THE INVENTION

A high-speed memory device includes pipelined row and column address paths. In one embodiment, the memory device is a packetized memory device that receives a command packet including command and address information. The command information is processed by a command buffer and command sequencer and decoder. The address information is captured by an address capture circuit that extracts row, column, and bank addresses from the packet. The row addresses are latched in a row address latch responsive to a row strobe signal. Once the row address is latched, the address capture circuit is freed to capture an address from a subsequent packet. The latched row address is applied to a redundant row circuit that determine whether or not the last row address is for a defective row. If the address is for a defective row, the redundant row circuit outputs a replace signal and an address of a redundant row. The replace signal, the address of the redundant row, and the latched row signal are all input to a combining circuit. The combining circuit provides either the redundant row address or the latched row address to a row driver that includes an internal latch. The row driver latches the redundant row address or latched row address and drives the corresponding row of the array.

The captured column address is input to a column address latch that latches the column address responsive to a column strobe signal. The latched column address is then applied to a redundant column circuit that determines if the latched column address corresponds to a defective column. If the latched column address corresponds to a defective column, the redundant column circuit outputs an address of a redundant column and a replace signal. The redundant column address, the replace signal, and the latched column address are input to a combining circuit that outputs either the redundant column address or the latched column address to a column latch/decoder. The column latch/decoder applies the redundant column address or the latched column address to an I/O gating circuit. The I/O gating circuit interfaces with columns of the memory banks through sense amplifiers to activate the column identified by the redundant column address or the latched column address.

DETAILED DESCRIPTION OF THE INVENTION

Figure 1:
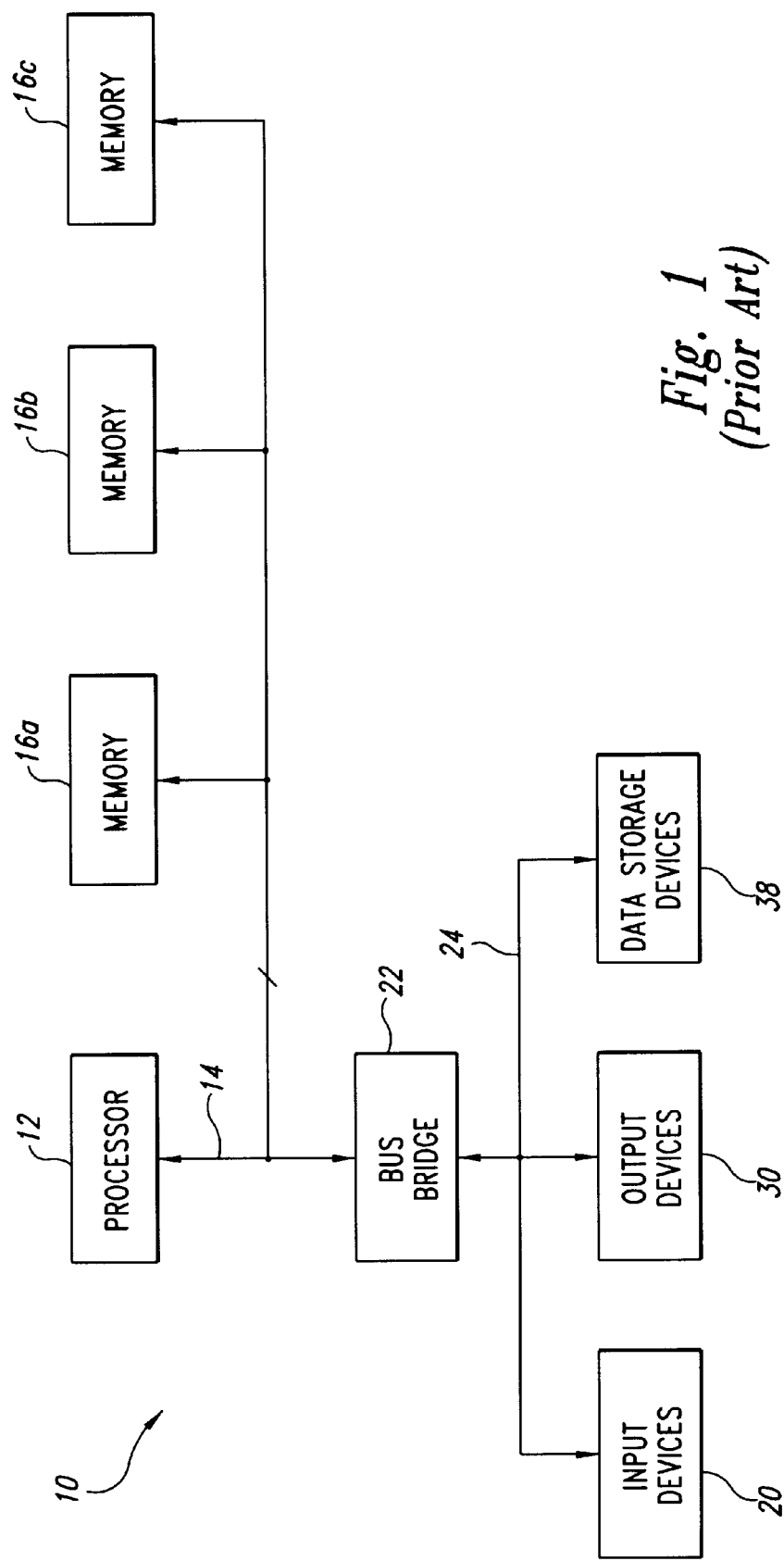
FIG. 1 is a block diagram of a computer system using SyncLink architecture.
Figure 2:
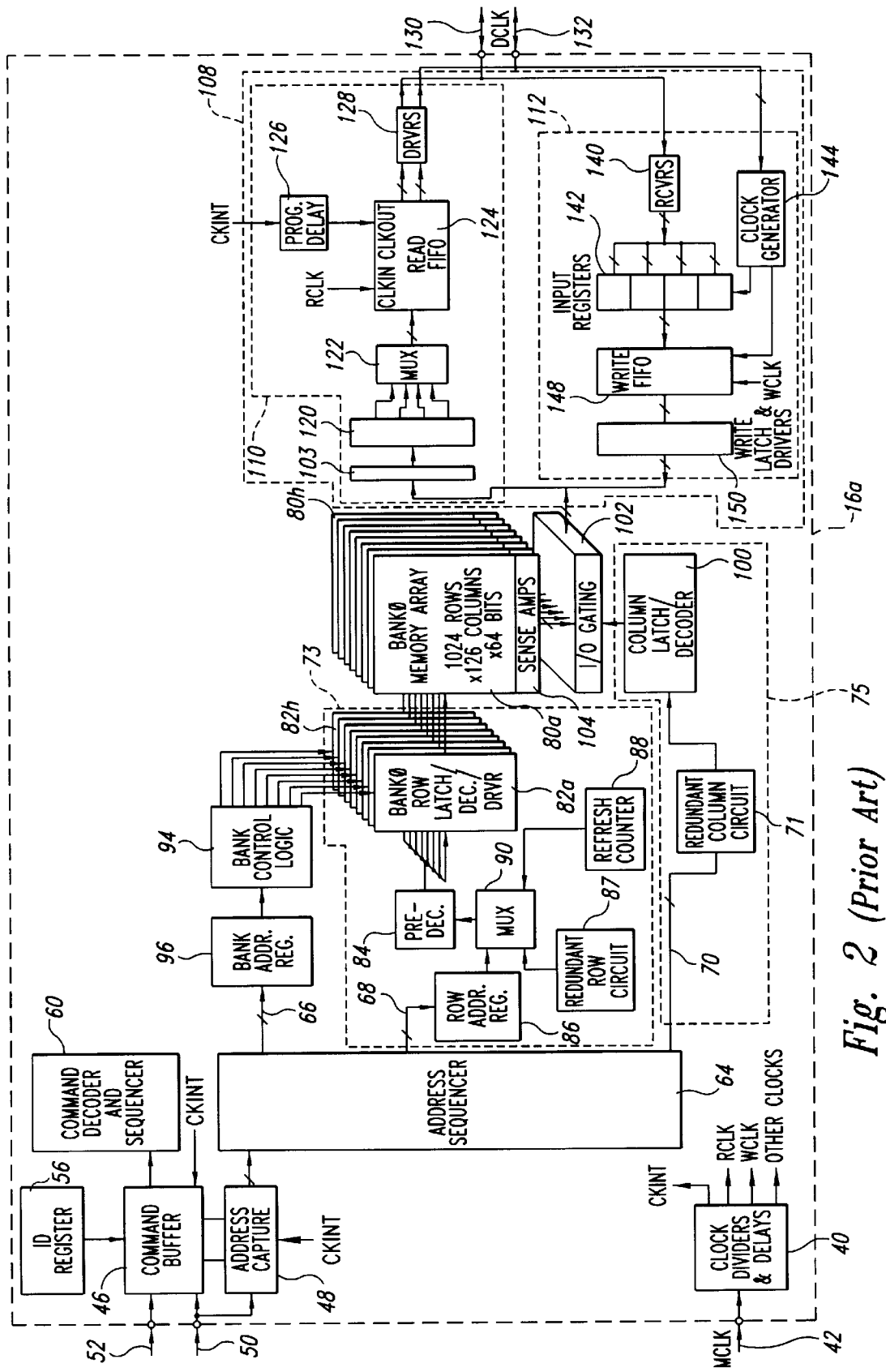
FIG. 2 is a block diagram of a packetized DRAM used in the computer system of FIG. 1.
Figure 3:
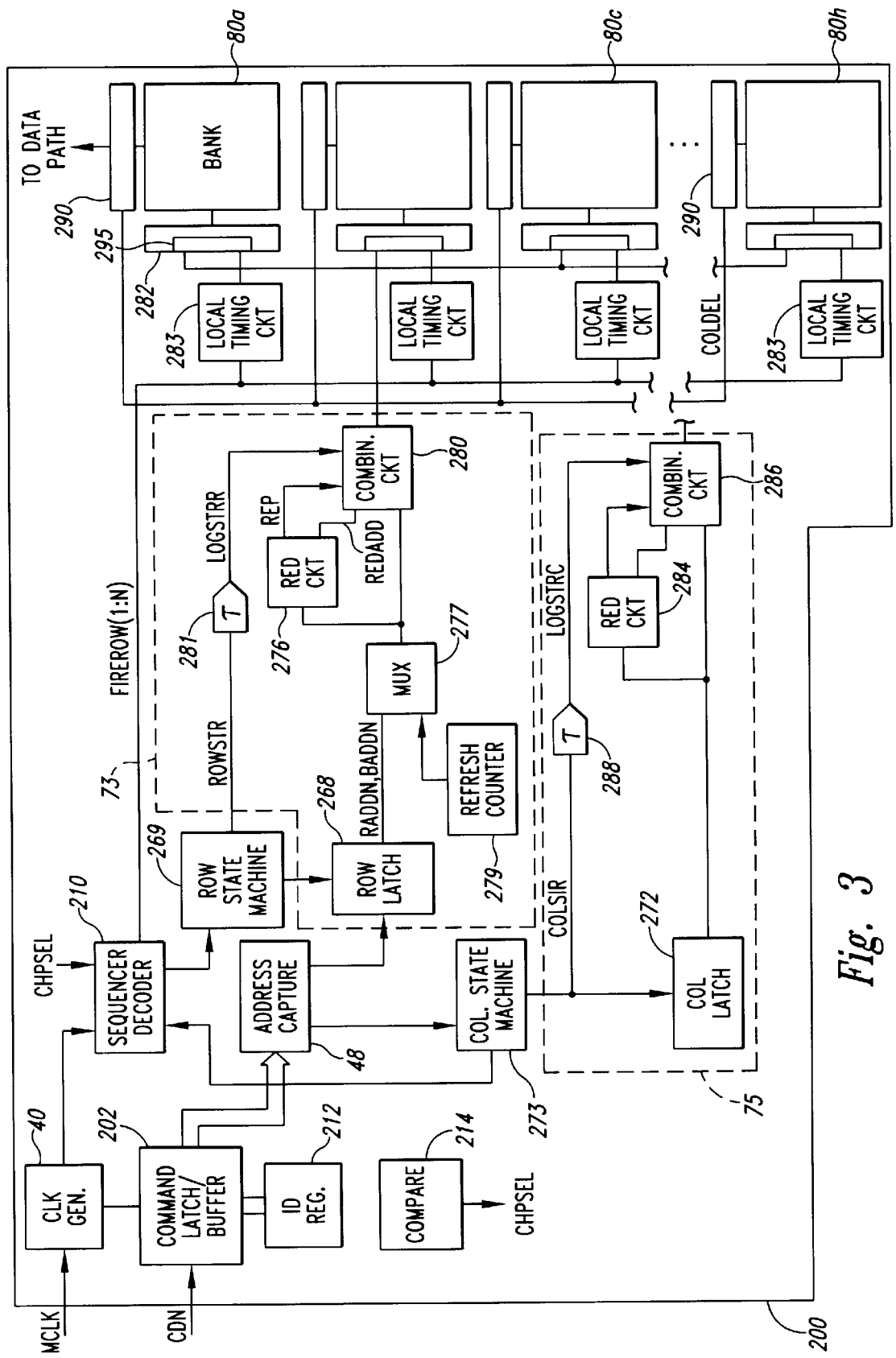
FIG. 3 is a block diagram of address paths coupled to banks of a memory array according to one embodiment of the invention that is usable in the packetized DRAM of FIG. 2.

One embodiment of a portion of a memory device 200 presented in FIG. 3 includes column and row address paths 73, 75 in accordance with the invention and may be used in the computer system shown in FIG. 1. The memory device 200 includes several of the same elements as the memory device 16 of FIG. 2, where elements common to both memory device 16, 200 are numbered the same. Also, one skilled in the art will recognize that several elements of the memory device 200, such as the read and write data paths have been omitted from FIG. 3 for clarity of presentation.

In the memory device 200, a command latch 202 receives a command packet CDN from a command bus 204. The width of the command bus 204 corresponds to the size of command latch 202, and the number of packet words in the command packet CDN corresponds to the number of stages of the command latch 202. In the embodiment shown in FIG. 3, the command latch has four stages, each of which is 10 bits wide. Thus, the command latch 202 sequentially receives four 10-bit packet words responsive to the internal clock signal CKINT from the clock divider and delay circuit 40. The command latch 202 latches packet words on every transition (either high-to-low or low-to-high) of the internal clock signal CKINT. Thus, the entire command packet CDN is received during two complete cycles of the internal clock signal CKINT.

In the embodiment shown in FIG. 3, the command latches 202 receive and store a 40-bit command word. However, in the more general case, the command latches 202 may have N stages, each of which has a width of M bits, so that the command latches store M*N bits of the command word. Once the command latches 202 are loaded, the latches output the command word CD to a sequencer and decoder 210, an ID register 212, and a compare circuit 214. The decoder 210, ID register 212, and comparator 214 determine whether the command word CD is intended for the memory device 200 containing the column and row address paths 73, 75. If the command word CD is intended for the memory device 200, the comparator 214 generates a chip select signal CHPSEL and other internal control signals for controllit operation of the memory device 200.

Unlike the memory device 16 of FIG. 2, in the memory device 200 of FIG. 3, the address capture circuit 48 outputs the 3-bit bank address and 10-bit row address to a row latch 268 within the row address path 73 and outputs the 7-bit column address to a column latch 272 through a column state machine 273 within the column address path 75. Operation of the row address path 73 will be described first with reference to FIGS. 3 and 4.

Figure 4:
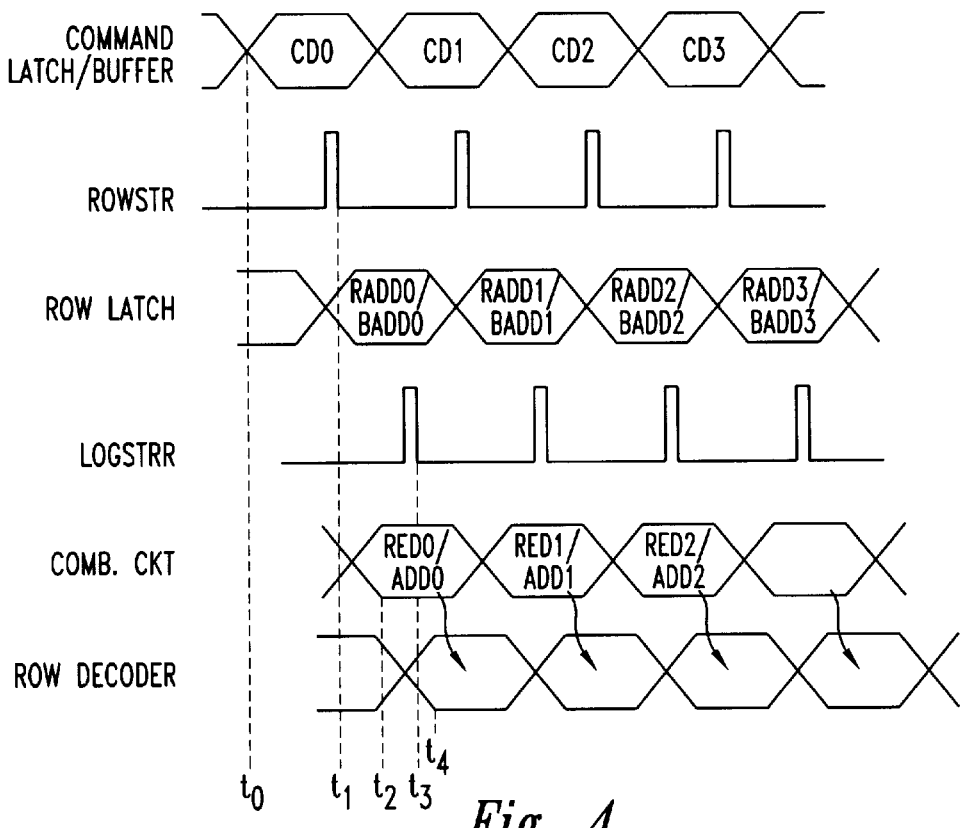
FIG. 4 is a signal timing diagram showing selected signals used in the row address path of FIG. 3.

As shown in FIG. 4, a first command word CD0 arrives at time to. Responsive to command signals from a command sequencer and decoder 210, a row state machine 269 determines that a 10-bit row address RADD0 and 3-bit bank address BADD0 have been captured by the address capture circuit 48 and outputs a row strobe signal ROWSTR at time $t_1$ that activates the row latch 268. In response, the row latch 268 latches the row address RADD0 and bank address BADD0 and provides the latched addresses RADD0, BADD0 to a multiplexer 277 that also receives refresh addresses from a refresh counter 279. The multiplexer 277 forwards the latched addresses RADD0, BADD0 or the refresh address to a combining circuit 280. Once the first row address RADD0 and bank address BADD0 are latched, the command latches 202 no longer need to provide the row and bank address bits of the command word CD0 to the address capture circuit 48. One skilled in the art will recognize that, by latching the row address RADD0 in the row latch 268 at time $t_1$, the command latch 202 is thus freed to receive a new command packet.

After the row latch 268 latches the first row address RADD0 and first bank address BADD0, redundant row circuitry 276 determines in a conventional fashion whether the first row and bank address RADD0, BADD0 or refresh address correspond to a defective row. If the row and bank addresses RADD0, BADD0 or refresh address correspond to a defective row, the redundant detect circuitry 276 outputs a replace signal REP and a redundant row address REDADD. The replace signal REP and redundant row address REDADD are applied to the combining circuit 280 along with the row and bank address RADD0, BADD0 or the refresh address from the multiplexer 277.

Although the combining circuit 280 receives an address at time $t_2$, the combining circuit 280 output does not change until the row state machine 269 supplies a row logic strobe LOGSTRR through a delay circuit 281 at time $t_4$, as shown in the fourth line of FIG. 4. At time $t_4$, the combining circuit 280 outputs either the redundant row address REDADD or the address from the multiplexer 279 to row decoders 282 coupled to each of the banks 80a–80h. Additionally, the combining circuit 280 provides the 3-bit bank address BADD0 to enable one of the eight decoders 282. The actual activation of the row or redundant row by the decoder 282 is triggered by local timing signals from a respective local timing circuit 283 in response to a global signal FIREROWN, which may originate in the row state machine 269 or the command sequencer and decoder 210. The global signal FIREROWN may be applicable to all of the banks 80a–80h or may be specific to one of the banks.

In response to the global signal FIREROWN, the local timing circuit 283 provides signals for activating the row decoder 282 and for activating a latch 295 that latches the address from the combining circuit 280. Additionally, the local timing circuit 283 generates additional signals such as a precharge signal, an equilibrate signal, a sense signal, and an isolation signal that control precharging, equilibration, and reading to or writing from the respective banks 80a–80h. By locally generating the signals that activate the row decoder 282 and other circuitry, the local timing circuits 283 reduce the number of lines extending between the sequencer and decoder 210 and the row decoders 282. The decoders 282 remain active until the corresponding global signal FIREROWN becomes inactive.

At time $t_3$, while the row latch 268, redundant row circuitry 276 and row decoder 282 are processing the first row and bank addresses RADD0, BADD0, a second command packet CD1 reaches the command latches 202. The address capture circuit 48 can begin capturing second row and bank addresses RADD1, BADD1 immediately, because changes in the output of the address capture circuitry 48 will not affect the addresses received by the decoder 282 and redundant row circuitry 276 until the next pulse of the address strobe ROWSTR. The address capture circuit 48 can thus capture the second addresses RADD1, BADD1 earlier than would be the case if the row address latch 268 were not present.

Figure 5:
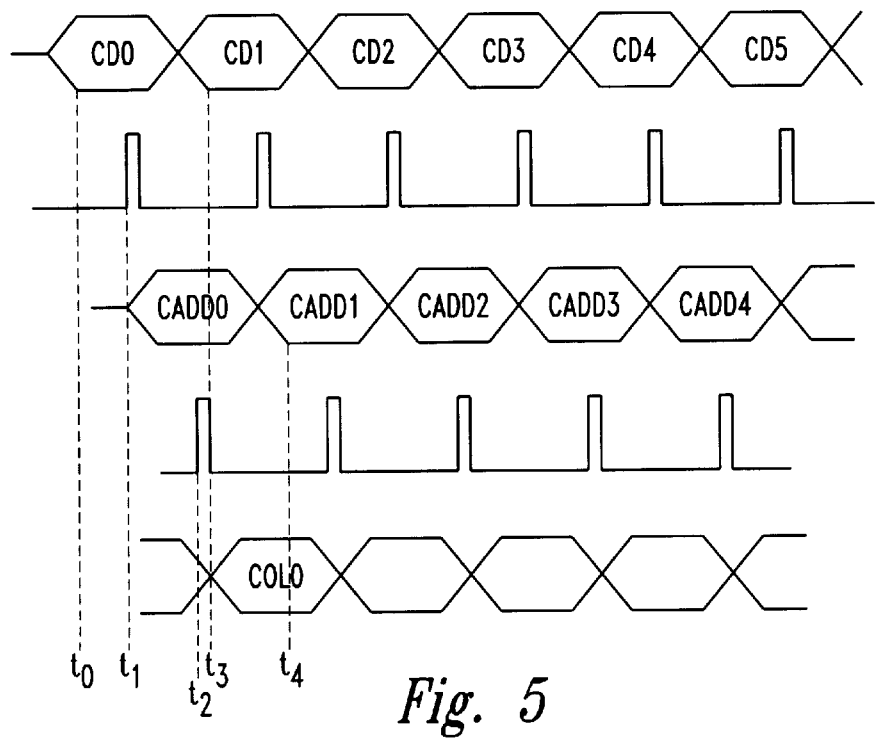
FIG. 5 is a signal timing diagram showing selected signals used in the column address path of FIG. 3.

Operation of the column address path 73 will now be described with reference to FIGS. 3 and 5. As shown in FIG. 5, a first command packet CD0 arrives at the command latches 202 at time $t_0$. By time $t_1$, the address capture circuit 48 has captured the column address CADD0, and the column state machine 273 outputs a column strobe signal COLSTR to activate a column latch 272. The column latch 272 latches the column address CADD0 and provides the column address CADD0 to redundant column circuitry 284 and to a column combining circuit 286. The redundant column circuitry 284 determines whether the column address CADD0 corresponds to a defective column and indicates to the column combining circuit 286 whether or not to substitute a redundant column for the column indicated by the column address CADD0. At time $t_3$, a delay circuit 288 provides a column logic strobe LOGSTRC to the column combining circuit 286 responsive to the column strobe COLSTR. In response to the logic strobe LOGSTRC, the column combining circuit 286 outputs either the address of the redundant column or the column address CADD0 to a column decoder 290 to activate columns in one or more of the banks 80a–h.

When the second command packet CD1 is received at time $t_3$, the column latch 272 has already latched the first column address CADD0. Therefore, the address capture circuitry 48 can immediately accept the second command CD1 and begin extracting the second column address word CADD1. The second command CD1 will then be latched at time $t_4$, after the first column has been accessed.

It should be noted that the operations of the column and row paths 73, 75 are not necessarily identical. As noted above, each command packet CDN is latched over two cycles of the internal clock CKINT (i.e., on four clock transitions or "ticks") and the corresponding data may be output to the data bus 130 (FIG. 2) several clock cycles later. Although data are written to or read from the banks 80a–h over two clock cycles, the amount of time necessary to charge a row can be quite long relative to the actual time that data are actually being written to or read from a bank. To accommodate this long charging time, the decoder 282 includes an internal latch 295 that latches the row address RADD0 or redundant row address REDADD from the combining circuit 280. The row address RADD0 remains latched until the global signal FIREROWN transitions to an inactive state.

The activated row may remain activated for several cycles of the internal clock CKINT. Consequently, sequentially activated rows will be in different banks to prevent simultaneous activation of two rows in a single bank 80a–80h. For example, the bank address BADD0 accompanying a first row address RADD0 may correspond to a first of the banks 80a and a bank address BADD1 accompanying a second row address RADD1 would correspond to a different bank 80b–80h. The local timing circuits 283 activate a single row in a given bank. Due to their physical structure and the fact that accessing a column typically involves simply sensing digit line voltages, columns are activated and de-activated much more quickly than rows. Consequently, two columns in a single bank may be accessed sequentially.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A pipelined address path for a memory device receiving a signal including a first address comprising:
    a first address capture circuit adapted to capture the first address, the first address capture circuit having a first expected address capture interval;
    a first address latch having a first latch input coupled to the first address capture circuit, a first latch control input, and a first address output, the first address latch being responsive to a first latch signal at the first latch control input to latch the first address from the first address capture circuit;
    a first address decoder having a first address input coupled to the first address output and a decoder output adapted for coupling to a memory bank; and
    a timing control circuit having a first timing signal output coupled to the first latch control input and a timing input adapted to receive the signal including the first address, the timing control circuit being responsive to the signal including the first address to produce the first latch signal after the first expected address capture interval.

2. The pipelined address path of claim 1 wherein the received signal includes a second address and further comprising:
    a second address capture circuit adapted to capture the second address, the second address capture circuit having a second expected address capture interval;
    a second address latch having a second latch input coupled to the second address capture circuit, a second latch control input, and a second address output, the second latch circuit being responsive to a second latch signal at the second latch input to latch data from the second address capture circuit;

a second address decoder having a second address input coupled to the second address output; and wherein the timing control circuit includes a second timing signal output coupled to the second latch control input, the timing control circuit being responsive to the signal including the second address to produce the second latch signal after the second expected address capture interval.

3. The pipelined address path of claim 1 wherein the memory device is a packetized memory device having a command data input adapted to receive the signal including the first address, further comprising a command latch coupled to the command data input.

4. The pipelined address path of claim 1 wherein the first address is a row address and wherein the timing control circuit includes a third timing signal output, and wherein the timing control circuit is responsive to the signal including the first address to produce a third control signal, the address path further including a local timing circuit responsive to the third control signal to generate decoder control signals.

5. A packetized memory device, comprising:

an address capture circuit adapted to capture an address from an address bus;

an address latch coupled to the address capture circuit and responsive to a latch timing signal to latch the captured address;

a sequencer and decoder coupled to the address capture circuit;

an address state machine coupled to the sequencer and decoder and including a first clock output coupled to the address latch;

a memory array;

data transfer circuitry coupled between the address latch and the memory array, the data transfer circuitry being responsive to the latched data to activate a row or column of the array corresponding to the latched address; and an address decoder coupled between the address latch and the data transfer circuitry and further coupled to a second clock output on the address state machine.

6. The memory device of claim 5 wherein the memory array includes a plurality of banks, the captured address includes a bank address and the data transfer circuitry includes a plurality of bank select circuits each having a respective bank select input coupled to the address decoder, each bank select circuit being responsive to a selected bank address to activate a corresponding one of the banks.

7. The memory device of claim 6, further including a redundant detect circuit having an input coupled to the address latch and a combination circuit having a first input coupled to an output of the redundant detect circuit, a second input coupled to the address latch, and an output coupled to the address decoder.

8. The memory device of claim 7 wherein the address decoder includes an internal address latch.

9. A packetized memory device, comprising:

a memory array;

command latches having input terminals adapted to receive command packets including a row address or a column address;

a first address capture circuit coupled to the command latch and responsive to capture the row or column address from the command latch;

a row or column address latch having an input terminal coupled to the address capture circuit and a control input, the row or column address latch being responsive to latch the captured row or column address from the address capture circuit in response to a timing control signal at the control terminal, the row or column address latch further including an output terminal;

a row or column state machine coupled to a sequencer and decoder and to the row or column address latch, the sequencer and decoder coupled to the command latches and responsive to the command packets to output a control signal, the row or column state machine responsive to the control signal to output the timing control signal; and a row or column decoder coupled between the memory array and the output terminal of the row or column latch, the row or column decoder being responsive to activate a row or column of the memory array responsive to the latched row or column address.

10. The memory device of claim 9 further comprising:

a redundant row or column detect circuit having a detect input coupled to the row or column latch output terminals, the redundant row or column detect circuitry further including detect output terminals configured to provide redundant row or column data; and a combining circuit coupled between the row or column latch and the row or column decoder and between the redundant row or column detect circuit and the row or column decoder, the combining circuit having a first input coupled to the row or column latch output terminal, a second input coupled to the detect output terminals, a clock input terminal, and an address output coupled to the row or column decoder, the combining circuit being responsive to provide one or the other of the row or column data from the address capture circuit or the redundant row or column data to the decoder in response to a clocking signal at the clock input terminal.

11. The memory circuit of claim 10 wherein the row or column decoder includes an input latch circuit and further wherein the sequencer and decoder is configured to output the clocking signal.

12. The memory device of claim 11 wherein the input latch circuit includes a latch terminal, further comprising a logic control circuit having a command input coupled to the sequencer and decoder and a global signal output coupled to the latch control input.

13. A computer system, comprising:

a processor;

an input device coupled to the processor;

an output device coupled to the processor;

a storage device coupled to the processor;

a bus coupled to the processor; and a memory device including:

a memory array;

command latches coupled to the bus, and adapted to receive signals including a row or column address from the bus;

a first address capture circuit coupled to the command latch and responsive to capture the row or column address from the command latch;

a row or column address latch having an input terminal coupled to the address capture circuit and a control input, the row or column address latch being responsive to latch the captured row or column address from the address capture circuit in response to a timing control signal at the control terminal, the row or column address latch further including an output terminal;

a row or column state machine coupled to a sequencer and decoder and to the row or column address latch, the sequencer and decoder coupled to the command latches and responsive to the command packets to output a control signal, the row or column state machine responsive to the control signal to output the timing control signal; and a row or column decoder coupled between the memory array and the output terminal of the row or column latch, the row or column decoder being responsive to activate a row or column of the memory array responsive to the latched row or column address.

14. The computer system of claim 13 wherein the memory device further includes:

a redundant row or column detect circuit having a detect input coupled to the row or column latch output terminals, the redundant row or column detect circuitry further including detect output terminals configured to provide redundant row or column address; and a combining circuit coupled between the row or column latch and the row or column decoder and between the redundant row or column detect circuit and the row or column decoder, the combining circuit having a first input coupled to the row or column latch output terminal, a second input coupled to the detect output terminals, a clock input terminal, and an address output coupled to the row or column decoder, the combining circuit being responsive to provide one or the other of the row or column address from the address capture circuit or the redundant row or column address to the decoder in response to a clocking signal at the clock input terminal.

15. The computer system of claim 14 wherein the row or column decoder includes an input latch circuit and further wherein the sequencer and decoder is configured to output the clocking signal.

16. The computer system of claim 15 wherein the input latch circuit includes a latch terminal, further comprising a logic control circuit having a command input coupled to the sequencer and decoder and a global signal output coupled to the latch control input.

17. A method of transferring data between a memory device and a data bus, comprising:

monitoring an externally accessible address input for receipt of a first address;

initiating a first control signal in response to receiving the first address;

latching the first address in a first address latch in response to receipt of the first control signal;

detecting defective memory locations and generating a redundant address signal;

combining the redundant address signal and the first address in a combining circuit;

transmitting an address signal from the combining circuit to a decoder in response to a second control signal;

decoding the address signal from the combining circuit;

reading data from or writing data to a location indicated by the decoded address signal;

after latching the first address and before completing the step of reading data into or writing data from the location indicated by the decoded address signal, receiving a second address at the address input; and latching the second address in response to receiving the second address and a third control signal.

18. The method of claim 17, further comprising, while the second address is latched, receiving a third address at the address input.

19. The method of claim 17 wherein receiving the first address includes the steps of:

receiving a first command packet containing data corresponding to the first address; and capturing the data corresponding to the first address from the command packet.

20. The method of claim 19 wherein receiving the second address includes the steps of:

receiving a second command packet containing data corresponding to the second address; and capturing the data corresponding to the second address from the command packet.

* * * * *